(12) United States Patent
Wang et al.

(10) Patent No.: US 9,274,197 B2
(45) Date of Patent: Mar. 1, 2016

(54) MAGNETIC RESONANCE IMAGING DATA SAMPLING METHODS AND SYSTEMS

(71) Applicant: General Electric Company, Schenectady, NY (US)

(72) Inventors: Kang Wang, Madison, WI (US); Peng Lai, Foster City, CA (US); James Hartman Holmes, Madison, WI (US); Frank R. Korosec, Middleton, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 554 days.

(21) Appl. No.: 13/691,327

(22) Filed: Nov. 30, 2012

(65) Prior Publication Data

US 2014/0152303 A1 Jun. 5, 2014

(51) Int. Cl.
*G01V 3/00* (2006.01)
*G01R 33/561* (2006.01)
*G01R 33/48* (2006.01)

(52) U.S. Cl.
CPC .......... *G01R 33/561* (2013.01); *G01R 33/4824* (2013.01)

(58) Field of Classification Search
CPC ............. G01R 33/5611; G01R 33/561; G01R 33/4824
USPC ................................................ 324/300–322
See application file for complete search history.

(56) References Cited

U.S. PATENT DOCUMENTS

| 7,592,808 B1* | 9/2009 | King | 324/307 |
| 2008/0187196 A1 | 8/2008 | Hu et al. | |
| 2008/0197842 A1* | 8/2008 | Lustig et al. | 324/307 |
| 2011/0241677 A1* | 10/2011 | Busse et al. | 324/309 |

OTHER PUBLICATIONS

Partial Fourier Techniques, accessed online at http://mri-q.com/partial-fourier.html on Apr. 27, 2015.*
Liu, et al., Compressed sensing MRI combined with SENSE in partial k-space, Phys. Med. Biol. 57, Oct. 16, 2012.*
McGibney, et al., Quantitative Evaluation of Several Partial Fourier Reconstruction Algorithms Used in MRI, Department of Electrical and Computer Engineering, and theDepartment of Radiology (A.C.), University of Calgary, Calgary, Alberta, Canada, 1993.*
Feinberg, et al, Halving MR Imaging Time by Conjugation: Demonstration at3.5kG, Radiology, 161:527-531, 1986.*
Margosian, et al., Faster MR Imaging Methods, SPIE vol. 593 Medical Image Processing, 1985.*
Hu, Houchun H., et al.; "Combination of 2D Sensitivity Encoding and 2D Partial Fourier Techniques for Improved Acceleration in 3D Contrast-Enhanced MR Angiography," Magn Reson Med. Jan. 2006; 55(1):16-22; 14 pages.

(Continued)

*Primary Examiner* — Daniel Miller
(74) *Attorney, Agent, or Firm* — Fletcher Yoder, P.C.

(57) ABSTRACT

A magnetic resonance imaging data sampling method includes randomly undersampling a first half of a k-space plane such that a plurality of points in the first half are sampled points and the remaining plurality of points in the first half are unsampled points. The method also includes determining, for each sampled point in the first half, a corresponding point in a second half of the k-space plane that corresponds to the point-wise complex conjugate location of the sampled point.

15 Claims, 5 Drawing Sheets

(56) References Cited

OTHER PUBLICATIONS

Lustig, Michael, et al.; "Sparse MRI: The Application of Compressed Sensing for Rapid MR Imaging"; Magn. Reson. Med., 58:1182-1192 (2007).

Madhuranthakam, Ananth J., et al; "Undersampled Elliptical Centric View-Order for Improved Spatial Resolution in Contrast-Enhanced MR Angiography"; Magn. Reson. Med. 55:50-58 (2006).

Noll, Douglas C., et al.; "Homodyne Detection in Magnetic Resonance Imaging"; IEEE Transactions on Medical Imaging, vol. 10, No. 2, Jun. 1991, pp. 154-163.

* cited by examiner

MAGNETIC RESONANCE IMAGING DATA SAMPLING METHODS AND SYSTEMS

STATEMENT REGARDING FEDERALLY SPONSORED RESEARCH & DEVELOPMENT

This invention was made with government support under EB006882 awarded by the National Institutes of Health to the University of Wisconsin. The government has certain rights in the invention. No federal funding was received by General Electric Company.

BACKGROUND

The present invention relates to magnetic resonance imaging data collection and processing, and more specifically, to methods for accelerating magnetic resonance data collection and synthesizing images from the collected data.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to process around the axis of their equilibrium magnetization. During this precession, RF fields are emitted by the spinning, processing nuclei and are detected by either the same transmitting RF coil, or by a separate coil. These signals are amplified, filtered, and digitized. The digitized signals are then processed using one or more algorithms to reconstruct a useful image.

Techniques have been developed to perform MRI imaging sequences quickly, so as to avoid long breath holds required of patients, to obtain images of rapidly changing anatomies (e.g., the beating heart), and/or to monitor the flow of one or more fluids (e.g., contrast agents) through various anatomies. Some such techniques acquire less than all of the information normally utilized for image reconstruction, requiring that the absent data be estimated in some way for proper, high quality image creation. However, current techniques for such estimation are often inadequate or subject to further improvement. For example, it is often difficult to obtain temporal and spatial resolution using accelerated imaging techniques that is sufficient for diagnostic purposes. Accordingly, it is now recognized that a need exists for improved methods for data acquisition, estimation, and reconstruction in magnetic resonance imaging techniques.

BRIEF DESCRIPTION

In one embodiment, a magnetic resonance imaging method includes randomly undersampling a first portion of a k-space plane and computing, for each randomly undersampled point in the first portion of the k-space plane, a corresponding point at a complex conjugate location in a second portion of a k-space sampling pattern corresponding to a second portion of the k-space plane. The method also includes sampling additional points in either the first portion or the second portion of the k-space plane that have not been sampled or computed and computing, for each additional sampled point, a corresponding point at complex conjugate location.

In another embodiment, a magnetic resonance imaging data sampling method includes randomly undersampling a first half of a k-space plane such that a plurality of points in the first half are sampled points and the remaining plurality of points in the first half are unsampled points. The method also includes determining, for each sampled point in the first half, a corresponding point in a second half of a k-space sampling pattern that corresponds to the point-wise complex conjugate location of the sampled point in the first half.

In another embodiment, a non-transitory computer readable medium encoding one or more executable routines, which, when executed by a processor, cause the processor to perform acts including sampling magnetic resonance imaging data in an incoherent sampling pattern. For each k-space location pair of points in a phase-encoding plane that are symmetric about an origin, one of the pair of points is sampled and the other of the pair of points is not sampled and is computed by using the complex conjugate of the sampled point.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described in more detail below, provided herein are data sampling methods and systems for magnetic resonance imaging (MRI). As compared to traditional techniques, the disclosed embodiments may enable increased image quality and a reduction in the length of time required for MRI data acquisition and processing. More specifically, certain embodiments of the provided data sampling methods may provide for pseudo-random undersampling of the outer k-space while maintaining conjugate symmetry, such as that typically required for standard partial Fourier (PF) processing. That is, the provided data sampling methods provide for a sampling pattern that is both incoherent (i.e., the point spread function includes a main peak with suppressed side lobes) as well as suitable for PF reconstruction (i.e., for each k-space location pair of points in a phase-encoding plane that are symmetric about an origin, one of the pair of points is sampled and the other of the pair of points is not sampled). These and other features of the data sampling methods and systems provided herein are discussed below.

Figure 1:
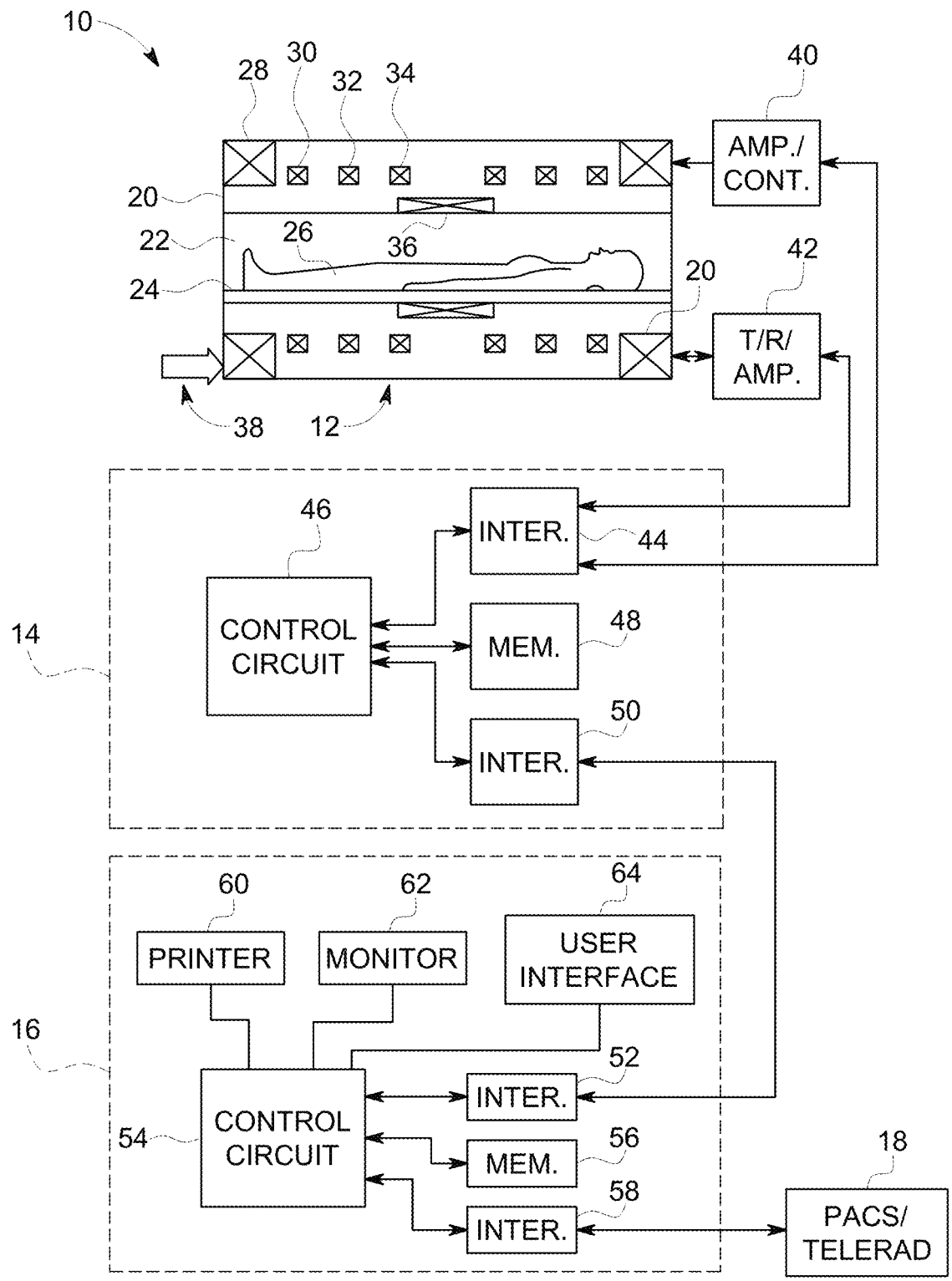
FIG. 1 is a diagrammatic illustration of an embodiment of a magnetic resonance imaging system configured to perform the data acquisition and image reconstruction described herein.

The embodiments described herein may be performed by a magnetic resonance imaging (MRI) system, wherein specific imaging routines (e.g., accelerated imaging routines for dynamic MRI sequences) are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as accelerated imaging sequences. System 10 additionally includes remote access and storage systems or devices as picture archiving and communication systems (PACS) 18, or other devices such as teleradiology equipment so that data acquired by the system 10 may be accessed on-site or off-site. In this way, acquired data may be acquired, followed by on-site or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing a controlled magnetic field and for detecting emissions from gyromagnetic material within the anatomy of the subject being imaged. A primary magnet coil 28 is provided for generating a primary magnetic field generally aligned with the bore 22. A series of gradient coils 30, 32, and 34 permit controlled magnetic gradient fields to be generated during examination sequences. A radio frequency (RF) coil 36 is provided for generating radio frequency pulses for exciting the gyromagnetic material, such as for spin perturbation or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

Scanner control circuit 14 includes an interface circuit 44 that outputs signals for driving the gradient field coils and the RF coil and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. For example, the programming code may execute one or more algorithms capable of performing accelerated imaging sequences and processing undersampled image data, which will be discussed in detail below. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith produce magnetic fields and radio frequency pulses in a controlled manner to excite and encode specific gyromagnetic material within the patient 26. The scanner 12 and control circuit 46 also sense the signals emanating from such material and create an image of the material being scanned. In certain embodiments, the scan may be an accelerated scan resulting in an array of undersampled image data sets. It should be noted that the MRI system described is merely intended to be an example only, and other system types, such as "open" MRI systems may also be used. Similarly, such systems may be rated by the strength of their primary magnet, and any suitably rated system capable of carrying out the data acquisition and processing described below may be employed.

Specifically, aspects of the present disclosure include methods for accelerating the acquisition of magnetic resonance data and the processing of such data to construct a desired (e.g., a computationally and/or diagnostically-useful) image. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 56). Thus, when accessed locally and/or remotely, the acquired data may be manipulated by one or more processors contained within an application-specific or general purpose computer. The one or more processors may access the acquired data and execute routines including the image processing and reconstruction methods described herein.

Figure 2:
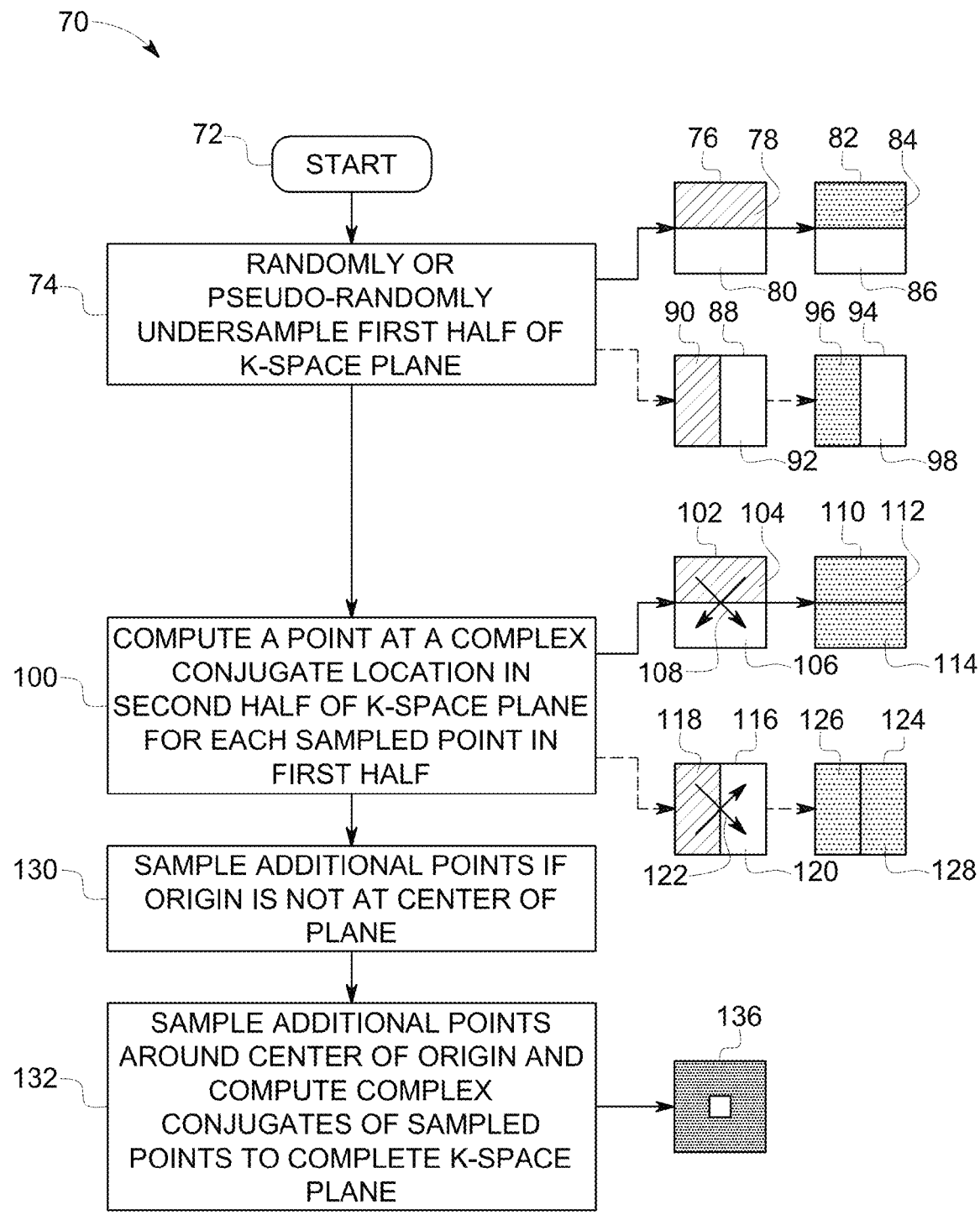
FIG. 2 is a process flow diagram of an embodiment of a method for performing an accelerated data sampling technique described herein.

FIG. 2 illustrates an embodiment of a data sampling method 70 that includes random or pseudo-random sampling for a two dimensional PF reconstruction. Accordingly, the method 70 includes a sampling pattern that is incoherent and provides for undersampling in a manner that preserves the ability to sample only one of each pair of points that are symmetric about an origin in a given k-space plane. More specifically, once the method 70 begins (block 72), a first half of a k-space plane is randomly or pseudo-randomly sampled (block 74). For example, as depicted in example plane 76, a top half 78 of the plane 76 is randomly or pseudo-randomly sampled on a point-by-point basis, and a bottom half 80 of the plane 76 is not sampled. This sampling pattern results in a plane 82 having a point sampled top half 84 and an unsampled bottom half 86.

It should be noted that the random undersampling of one half of the k-space plane may be performed on any desired continuous or discontinuous areas of the plane, regardless of their relative location to one another. For example, as illustrated by plane 88, the left half 90 of the plane 88 may be sampled while the right half 92 is not sampled, thus resulting in a plane 94 having a point-by-point sampled half 96 and an unsampled half 98. Again, any desired half may be sampled in other embodiments. Further, in some embodiments, any desired portion of the k-space plane, and not necessarily one half of the k-space plane, may be undersampled.

In the illustrated embodiment, the method 70 further includes computing a point at a complex conjugate location (i.e. symmetric location) in a second half of the k-space sampling pattern for each sampled point in the first half of the plane (block 100). That is, the complex conjugate location of each sampled point is calculated on a point-by-point basis. In other words, the method provides for computing the value of the point at a corresponding symmetric location. If one point in the first half is sampled (i.e. value of 1), then the corresponding symmetric location in the second half is 0 (i.e. not sampled). Further, if one point in the first half is not sampled (i.e. value of 0), then the corresponding symmetric location in the second half is 1 (i.e. needs to be sampled).

For example, as shown in plane 102, a complex conjugate located in the unsampled half 106 is computed for each point in the sampled half 104, as indicated by arrows 108. Accordingly, the plane 110 then includes a half 112 having randomly sampled points, and another half 114 having points that are computed at the complex conjugate location of the sampled points. Similarly, if the halves of the plane 116 are divided such that the left half 118 is sampled and the right half 120 is not sampled, points at the complex conjugate locations of each of the sampled points in the first half 118 are computed, as illustrated by arrows 122. Therefore, the plane 124 includes a half 126 with sampled points and a half 128 with computed points.

The method 70 proceeds with additional sampling of additional points if the mathematical origin is not located at the physical center of the k-space plane (block 130). As explained in more detail with respect to FIG. 3, in these instances, it may be desirable to sample one or more additional points to obtain the desired information. Further, the method 70 calls for the sampling additional points around the center of the origin and the subsequent computation of the corresponding complex conjugates (block 132). The foregoing method 70 then results in a summed mask or map 136 that may be utilized during image reconstruction.

Figure 3:
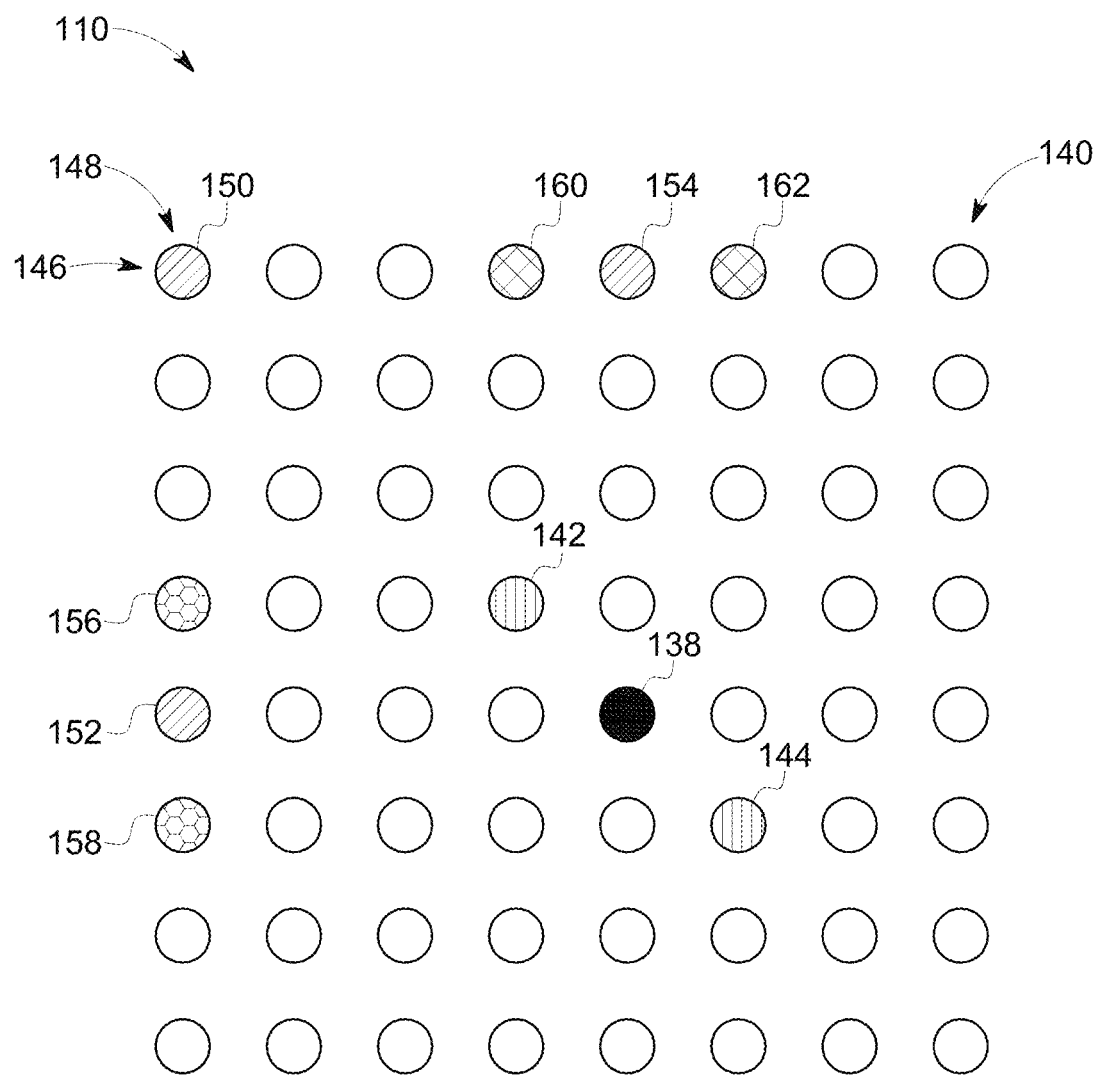
FIG. 3 is a schematic illustrating example points in a plane having a non-centered mathematical origin.

FIG. 3 is a schematic illustrating an instance in which a symmetric center point 138 for the purposes of mathematically computing points at complex conjugate locations is not located at the physical center of grid 140. In this illustration, since the point 138 is the symmetric center point for the grid 140, points 142 and 144 are corresponding points. That is, only one of points 142 and 144 need be sampled since the other of the points can be computed by using the complex conjugate of the sampled point.

In the illustrated example, since the symmetric center point 138 is located in the upper left corner of the lower right quadrant of the grid 140, the first row 146 and first column 148 may require additional sampling and/or processing. For example, the grid 140 may be a y-z plane, and the number of points in a row is eight and the number of points in a column is eight, thus making the point 138 at location (5,5) the symmetric center point. As such, points 150, 152, and 154 are symmetric about themselves and should each be sampled, for example, as indicated in block 130 of FIG. 2. Further, since points 156 and 158 are symmetric about point 152 (or symmetric about point 138, assuming a circular plane), one only of points 156 and 158 need be sampled; the other point can be computed using the complex conjugate of the sampled point. Similarly, since points 160 and 162 are symmetric about point 154, one only of points 160 and 162 need be sampled and the other may be computed.

Figure 4:
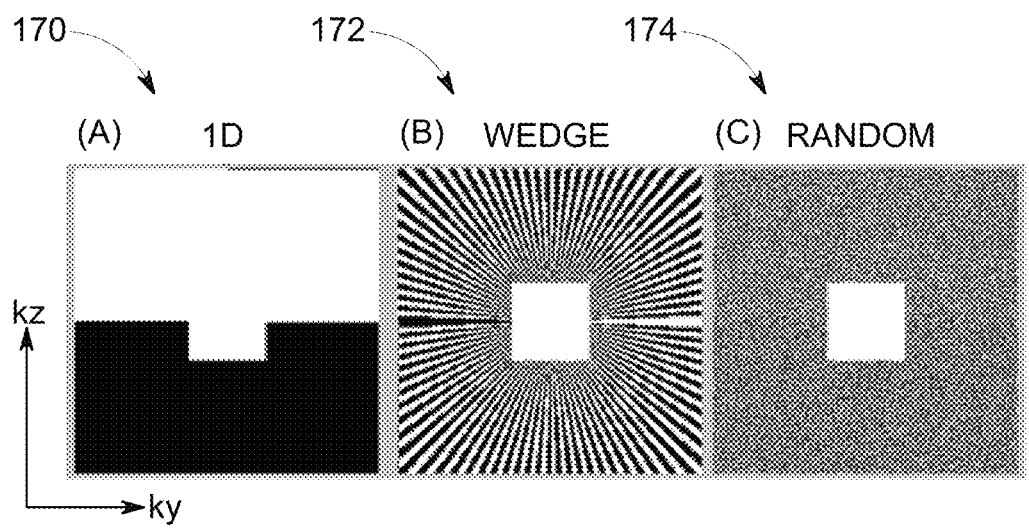
FIG. 4A is a schematic illustrating a one dimensional partial Fourier data sampling technique.
FIG. 4B is a schematic illustrating a wedge-based data sampling technique.
FIG. 4C is a schematic illustrating an embodiment of a random data sampling technique described herein.

FIGS. 4A, 4B, and 4C illustrate a one dimensional (1D) PF data sampling schematic 170, a wedge sampling schematic 172, and a random sampling schematic 174 in accordance with presently disclosed methods, respectively. The 1D PF schematic 170 illustrates a sampling method in which approximately half of the data in the outer k-space is not sampled. The wedge sampling schematic 172 illustrates a method that includes dividing the k-space into an even number of wedges and asymmetrically choosing the sampled wedges. The random sampling schematic 174 illustrates the method 70 of FIG. 3 in which the outer k-space is randomly undersampled by a factor of two while stilling satisfying the conjugate symmetry criteria for 2D PF processing.

Figure 5:
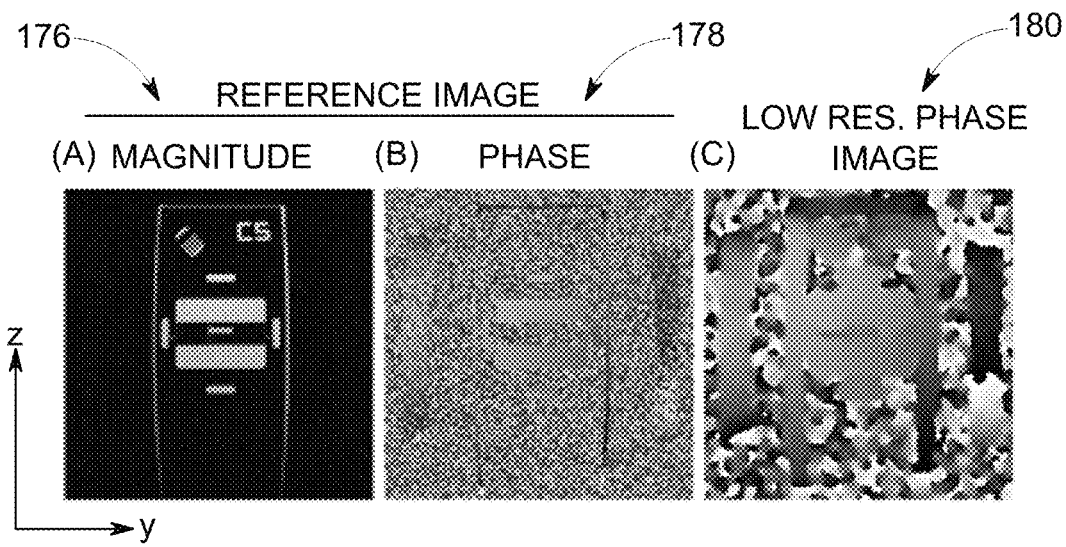
FIG. 5A illustrates the magnitude component of a reference image utilized in an example simulation.
FIG. 5B illustrates the phase component of a reference image utilized in an example simulation.
FIG. 5C illustrates a low resolution phase map for an example simulation.

FIGS. 5A and 5B represent a magnitude full resolution reference image 176 and a phase full resolution reference image 178 for an example phantom simulation. Further, FIG. 5C depicts a low resolution phase map 180 obtained from the central k-space for the example simulation. In the example simulation, phantoms were scanned using a single channel head coil, and a single fully-sampled slice was obtained from each phantom for simulation. The PF processing was performed in accordance with traditional techniques known to those skilled in the art. That is, a low resolution phase map was obtained from the low-pass filtered central k-space, and a high-pass filtered image was obtained from the original k-space data. Further, the phase map was demodulated from the high-pass filtered image. After demodulation, the magnitude of the real channel of the resulting image was used for visualization and comparison.

Figure 6:
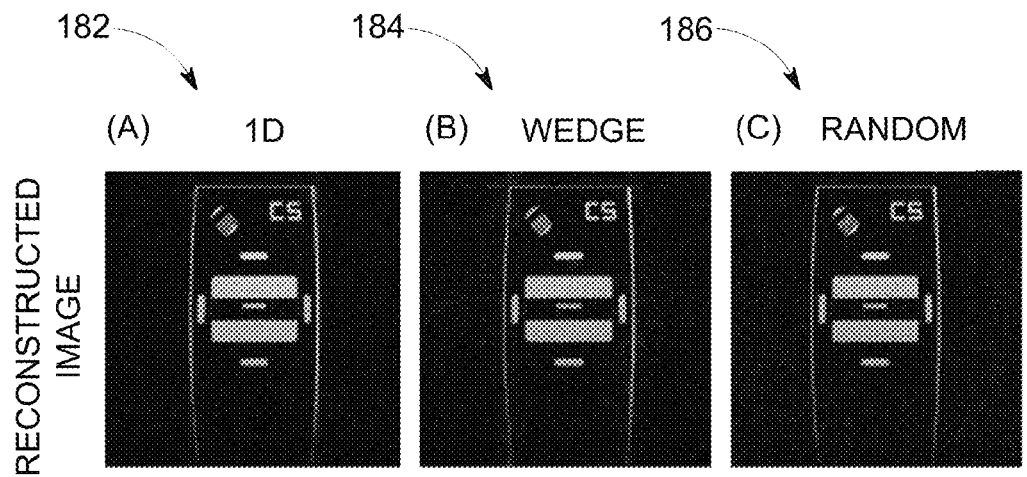
FIG. 6A illustrates a reconstructed image of a phantom obtained via a simulated one dimensional partial Fourier data sampling technique.
FIG. 6B illustrates a reconstructed image of a phantom obtained via a wedge-based data sampling technique.
FIG. 6C illustrates a reconstructed image of a phantom obtained in accordance with an embodiment of a simulated random data sampling technique described herein.
Figure 7:
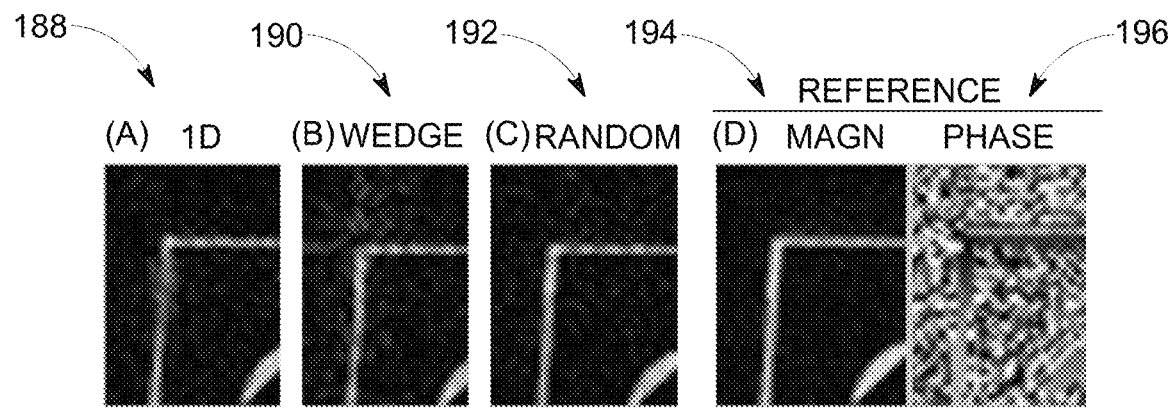
FIG. 7A illustrates a portion of the image shown in FIG. 6A in more detail.
FIG. 7B illustrates a portion of the image shown in FIG. 6B in more detail.
FIG. 7C illustrates a portion of the image shown in FIG. 6C in more detail.
FIG. 7D illustrates reference magnitude and phase images of the phantom shown in FIGS. 7A-C.

FIGS. 6A, 6B, and 6C illustrate reconstructed images 182, 184, and 186 obtained from data undersampled by the 1D, wedge, and presently disclosed random methods, respectively. FIG. 7A illustrates a portion 188 of image 182 corresponding to the top left corner of image 182 in more detail. FIG. 7B illustrates a portion 190 of image 184 corresponding to the top left corner of image 184 in more detail. Similarly, FIG. 7C illustrates a portion 192 of image 186 corresponding to the top left corner of image 186. Still further, FIG. 7D illustrates portions 194 and 196 corresponding to the top left corners of the reference images 176 and 178 for comparative purposes.

As illustrated by a comparison of the image portions 188, 190, and 192 with the reference image portion 194, in the top-left corner of the image where the phase is rapidly-changing (e.g., as compared to the central portion of the image where the reference phase map is smooth and well represented by a low resolution image), the presently disclosed data sampling embodiments may offer one or more advantages over traditional data sampling methods. More specifically, for example, as shown in FIG. 7A, the 1D image 188 shows residual blurring along the undersampling direction. While the wedge image 190 shows improved resolution, residual artifacts are still present. However, the image 192 corresponding to the random data sampling methods disclosed herein has improved image quality as compared to images 188 and 190. That is, the disclosed data sampling methods may result in less loss of resolution and reduced presence of structured artifacts as compared to traditional techniques. Further, the presently disclosed embodiments may reduce the quantity of coherent artifacts in areas of the image where the phase map changes rapidly, thus possibly improving the diagnostic usefulness of the reconstructed images.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) method performed by an MRI system having a primary field magnet, a plurality of gradient coils, a radiofrequency (RF) transmit coil, a plurality of RF receiving coils, and control circuitry configured to control the gradient field coils, the RF transmit coil, and the plurality of RF receiving coils, comprising:

randomly undersampling points in a first portion of a k-space plane outside of a center of the k-space plane using at least the control circuitry, the primary field magnet, the plurality of gradient coils, and the RF transmit and receiving coils to obtain sampled data points representative of a subject of interest;

computing, for each sampled data point in the first portion of the k-space plane, data representative of the subject of interest at a corresponding complex conjugate location in a second portion of the k-space plane using the control circuitry to obtain computed data points representative of the subject of interest;

sampling additional points that are symmetric about themselves and in the first portion of the k-space plane when a mathematical origin of the k-space plane used for computation of the data at the complex conjugate locations does not correspond to the center of the k-space plane using at least the control circuitry, the primary field magnet, the plurality of gradient coils, and the RF transmit and receiving coils to obtain additional sampled data points representative of the subject of interest;

computing, for each additional sampled data point, data representative of the subject of interest at a corresponding complex conjugate location using the control circuitry to obtain additional computed data points representative of the subject of interest;

generating a map corresponding to the k-space plane by compiling the sampled and computed data points using the control circuitry; and storing the map in memory circuitry associated with the control circuitry.

2. The method of claim 1, wherein the first portion comprises a first half of the k-space plane, and the second portion comprises a second half of the k-space plane.

3. The method of claim 1, wherein the k-space plane is a ky-kz plane.

4. The method of claim 1, comprising utilizing the generated map to generate one or more reconstructed images of the subject of interest using the control circuitry.

5. A magnetic resonance imaging (MRI) data sampling method performed by an MRI system having a primary field magnet, a plurality of gradient coils, a radiofrequency (RF) transmit coil, a plurality of RF receiving coils, and control circuitry configured to control the gradient field coils, the RF transmit coil, and the plurality of RF receiving coils, comprising:

randomly undersampling, using at least the control circuitry, the primary field magnet, the plurality of gradient coils, and the RF transmit and receiving coils, a first half of a k-space plane outside of a center of the k-space plane such that a plurality of points in the first half are sampled points having data representative of a subject of interest and the remaining plurality of points in the first half are unsampled points having no data representative of the subject of interest, and such that the center of the k-space plane remains unsampled;

determining, for each sampled point in the first half, a corresponding point in a second half of the k-space plane that corresponds to the point-wise complex conjugate location of the respective location of the sampled point using at least the control circuitry;

sampling, using at least the control circuitry, the primary field magnet, the plurality of gradient coils, and the RF transmit and receiving coils, one or more additional points that are symmetric about themselves and in one or more rows or columns of the first half of the k-space plane when a mathematical origin used for computation of the data points at the corresponding point-wise complex conjugate locations does not correspond to the center of the k-space plane to obtain additional sampled data points representative of the subject of interest; and storing the data representative of the subject of interest at the sampled locations in memory circuitry associated with the control circuitry.

6. The method of claim 5, comprising computing points at a complex conjugate location of at least one of the one or more additionally sampled points.

7. The method of claim 5, comprising sampling additional points in the second half of the k-space plane outside of the center of k-space that have not been sampled or computed.

8. The method of claim 7, comprising computing, for each additional sampled point, a point at a corresponding complex conjugate location in the first half of the k-space plane.

9. The method of claim 5, comprising generating a map corresponding to the k-space plane by compiling the sampled and computed points.

10. The method of claim 9, comprising utilizing the generated map to generate one or more reconstructed images of a subject or object.

11. A non-transitory computer readable medium for use in combination with a magnetic resonance imaging (MRI) system having a primary field magnet, a plurality of gradient coils, a radiofrequency (RF) transmit coil, a plurality of RF receiving coils, the computer readable medium encoding one or more executable routines which, when executed by a processor, cause the processor to control the MRI system to perform MRI data acquisition and cause the processor to perform MRI data processing, the MRI data acquisition and MRI data processing acts comprising:

sampling MRI data from a subject of interest in an incoherent sampling pattern in a first half of a phase-encoding plane of k-space using at least the primary field magnet, the plurality of gradient coils, and the RF transmit and receiving coils, wherein for each k-space location that is sampled according to the incoherent sampling pattern, there is a corresponding point that is symmetric about an origin and is not sampled but is computed by using the complex conjugate of the sampled point; and sampling MRI data from the subject of interest at one or more additional points that are symmetric about themselves and in one or more rows or columns of the first half of the phase-encoding plane when a mathematical origin of the phase-encoding plane used for computation of the complex conjugates does not correspond to a center of the phase-encoding plane.

12. The computer readable medium of claim 11, wherein the MRI data processing acts performed by the processor further comprise utilizing the sampled MRI data to reconstruct one or more images of an object or a subject.

13. The computer readable medium of claim 11, wherein the MRI data acquisition acts further comprise randomly sampling points only in one half of the phase-encoding plane outside of a center of the phase-encoding plane.

14. The computer readable medium of claim 11, wherein the MRI data processing acts performed by the processor comprise assembling the sampled points and the complex conjugates of the sampled points into an image map configured to be utilized during an image reconstruction process.

15. The computer readable medium of claim 11, wherein the MRI data processing acts comprise performing partial Fourier reconstruction on at least the sampled and computed MRI data to produce a reconstructed image.

* * * * *